United States Patent
Kim et al.

(10) Patent No.: US 8,470,626 B2
(45) Date of Patent: Jun. 25, 2013

(54) METHOD OF FABRICATING LIGHT EMITTING DIODE

(75) Inventors: Kwang Joong Kim, Ansan-si (KR); Chang Suk Han, Ansan-si (KR); Seung Kyu Choi, Ansan-si (KR); Ki Bum Nam, Ansan-si (KR); Nam Yoon Kim, Ansan-si (KR); Kyung Hae Kim, Ansan-si (KR); Ju Hyung Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 12 days.

(21) Appl. No.: 13/150,759

(22) Filed: Jun. 1, 2011

(65) Prior Publication Data

US 2012/0142134 A1    Jun. 7, 2012

(30) Foreign Application Priority Data

Jun. 4, 2010  (KR) .................. 10-2010-0052862

(51) Int. Cl.
*H01L 21/00* (2006.01)

(52) U.S. Cl.
USPC .......... 438/46; 438/77; 438/93; 438/285; 438/483; 438/502; 438/540; 438/569; 438/604; 257/E33.023; 257/E33.025; 257/E33.028; 257/E33.03; 257/E33.033; 257/E33.034; 257/E51.043

(58) Field of Classification Search
None
See application file for complete search history.

(56) References Cited

U.S. PATENT DOCUMENTS

| 5,270,247 | A | 12/1993 | Sakuma et al. |
| 5,994,158 | A | 11/1999 | Kashima et al. |
| 6,266,355 | B1 | 7/2001 | Sverdlov |
| 6,998,284 | B2 * | 2/2006 | Kyono et al. ............... 438/46 |
| 2002/0025661 | A1 * | 2/2002 | Nikolaev et al. ........... 438/505 |
| 2004/0004223 | A1 | 1/2004 | Nagahama et al. |
| 2006/0191474 | A1 | 8/2006 | Chen et al. |
| 2006/0267025 | A1 * | 11/2006 | Wuu et al. .................. 257/79 |
| 2008/0003838 | A1 | 1/2008 | Haukka et al. |

FOREIGN PATENT DOCUMENTS

| EP | 1 220 304 | 7/2002 |
| EP | 1 883 140 | 1/2008 |
| JP | 05-110139 | 4/1993 |
| JP | 2001-156003 | 6/2001 |

(Continued)

OTHER PUBLICATIONS

Non-Final Office Action of U.S. Appl. No. 12/193,588 issued on Feb. 25, 2010.

(Continued)

*Primary Examiner* — Julio J Maldonado
*Assistant Examiner* — Yasser Abdelaziez
(74) *Attorney, Agent, or Firm* — H.C. Park & Associates, PLC

(57) ABSTRACT

Exemplary embodiments of the present invention relate to a method of fabricating a light emitting diode (LED). According to an exemplary embodiment of the present invention, the method includes growing a first GaN-based semiconductor layer on a substrate at a first temperature by supplying a chamber with a nitride source gas and a first metal source gas, stopping the supply of the first metal source gas and maintaining the first temperature for a first time period after stopping the supply of the first metal source gas, decreasing the temperature of the substrate to the a second temperature after the first time period elapses, growing an active layer of the first GaN-based semiconductor layer at the second temperature by supplying the chamber with a second metal source gas.

18 Claims, 2 Drawing Sheets

FOREIGN PATENT DOCUMENTS

| | | |
|---|---|---|
| JP | 2006-128527 | 5/2006 |
| JP | 2006-245066 | 9/2006 |
| JP | 2008-034852 | 2/2008 |
| WO | 2005/117152 | 12/2005 |

OTHER PUBLICATIONS

Final Office Action of U.S. Appl. No. 12/193,588 issued on Jun. 4, 2010.

Non-Final Office Action of U.S. Appl. No. 12/535,244 issued on Jun. 18, 2010.

Final Office Action of U.S. Appl. No. 12/535,244 issued on Nov. 5, 2010.

Final Office Action of U.S. Appl. No. 12/535,244 issued on Jan. 21, 2011.

M. Iwaya, et al. "UV-LED Using p-Type GaN/AlN Supperlattice Cladding Layer", Phys. Stat. Sol. (c) vol. 0, No. 1. pp. 34-38 (2002).

European Search Report dated Jul. 19, 2012, issued in EP Patent Application No. 08012675.8.

\* cited by examiner

METHOD OF FABRICATING LIGHT EMITTING DIODE

CROSS-REFERENCE TO RELATED APPLICATION

This application claims priority from and the benefit of Korean Patent Application No. 10-2010-0052862, filed on Jun. 4, 2010, which is hereby incorporated by reference for all purposes as if fully set forth herein.

BACKGROUND OF THE INVENTION

1. Field of the Invention

Exemplary embodiments of the present invention relate to a method of fabricating a light emitting diode (LED), and more particularly, to a method of fabricating an LED having improved crystal quality.

2. Discussion of the Background

In general, gallium nitride (GaN)-based semiconductors are widely used for ultraviolet (UV) or blue/green light emitting diodes or laser diodes as light sources of full-color displays, traffic lights, general illuminators, and optical communication devices. Such a GaN-based light emitting device may have an InGaN-based active layer of a multiple quantum well structure, which is interposed between an n-type GaN semiconductor layer and a p-type GaN semiconductor layer, and emits light through recombination of electrons and holes in the active layer.

The n-type GaN semiconductor layer may be doped with silicon (Si) impurities, and the p-type GaN semiconductor layer may be doped with magnesium (Mg) impurities. Manufacturing process parameters of a GaN semiconductor layer, such as a total flow rate, a flow rate of source gas, a ratio of metal source gas and nitrogen gas, a growth temperature, and the like, may be selected depending on the composition of the GaN semiconductor layer, the kind of doping impurity, the kind of layer on which the GaN semiconductor layer is grown, and the like.

In a case where a high voltage such as static electricity is applied to an LED, the high voltage may damage the LED, and therefore, it may be necessary to ensure resistance against static electricity or the like. Particularly, in order to enhance the resistance of the LED against static electricity or the like, a leakage current may be reduced in the LED by improving the crystal quality of GaN-based semiconductor layers.

FIG. 1 shows a temperature profile of a method of fabricating an LED using a metal oxide chemical vapor deposition (MOCVD) method.

Referring to FIG. 1, an n-type GaN-based compound semiconductor layer is grown on a substrate at a temperature T1 of the substrate. During this time, a metal (e.g., Ga, Al or In) source gas, a nitride source gas, and a carrier gas are supplied onto the substrate. When the growth of the n-type GaN-based compound semiconductor layer is completed, the supply of the metal source gas is stopped, the temperature of the substrate is decreased to T2, and an active layer is grown on the n-type GaN-based compound semiconductor layer. After the growth of the active layer is completed, the supply of the metal source gas used to grow the active layer is stopped, the temperature of the substrate is increased from T2 to T3, and a p-type GaN-based compound semiconductor layer is grown on the active layer at T3. Here, a metal-organic material may be used as a raw material of the metal source gas, and $NH_3$ is used as the nitride source gas.

According to the conventional method, each GaN-based compound semiconductor layer may be grown at a suitable growth temperature and flow rate conditions. However, the LED fabricated using the aforementioned method may have a relatively high leakage current, and the LED may require a zener diode due to a low resistance against static electricity.

SUMMARY OF THE INVENTION

Exemplary embodiments of the present invention provide a method of fabricating an LED having improved crystal quality and low leakage current.

Additional features of the invention will be set forth in the description which follows, and in part will be apparent from the description, or may be learned by practice of the invention.

An exemplary embodiment of the present invention discloses a method of fabricating an LED including growing a first GaN-based semiconductor layer on a substrate at a first temperature by supplying a chamber with a nitride source gas and a first metal source gas, stopping the supply of the first metal source gas and maintaining the first temperature for a first time period after stopping the supply of the first metal source gas, decreasing a temperature of the substrate to a second temperature after the first time period elapses, and growing an active layer on the first GaN-based semiconductor layer at the second temperature by supplying the chamber with a second metal source gas.

An exemplary embodiment of the present invention also discloses a method of fabricating an LED including growing a first GaN-based semiconductor layer on a substrate at a first temperature by supplying a chamber with a nitride source gas and a first metal source gas, stopping the supply of the first metal source gas, decreasing a temperature of the substrate to a second temperature, growing an active layer on the first GaN-based semiconductor layer at the second temperature by supplying the chamber with a second metal source gas, stopping the supply of the second metal source gas after the active layer is grown, and increasing the temperature of the substrate from the second temperature to a third temperature during a first time period, the first time period is 5 to 15 minutes long.

An exemplary embodiment of the present invention also discloses a method of fabricating an LED including growing an active layer on a first GaN-based semiconductor layer at a first temperature by supplying a chamber with a nitride source gas and a first metal source gas, stopping the supply of the first metal source gas and maintaining the first temperature during a first time period after stopping the supply of the first metal source gas, and increasing the temperature of the substrate to a second temperature after the first time period elapses. Then, a second GaN-based semiconductor layer is grown on the active layer at the second temperature by supplying the chamber with a second metal source gas.

An exemplary embodiment of the present invention also discloses a method of fabricating a semiconductor device including growing a first semiconductor layer at a first temperature using a first metal source gas, stopping the supply of the first metal source gas, maintaining the first temperature for a first time period after stopping the supply of the first metal source gas, and growing an active layer at a second temperature different from the first temperature using a second metal source gas.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

Figure 1:
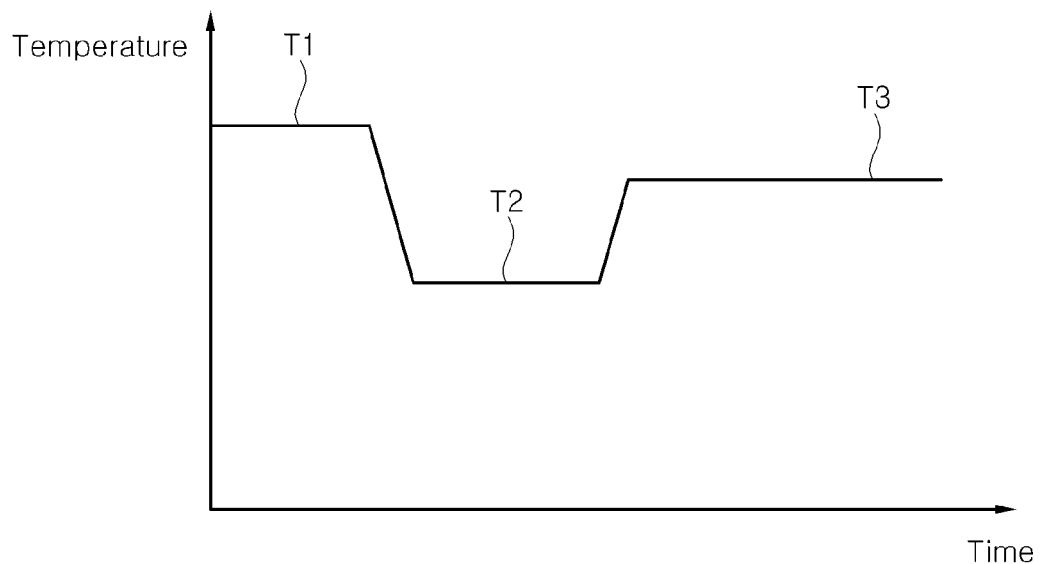
FIG. 1 shows a temperature profile of a conventional method of fabricating an LED.

Hereinafter, exemplary embodiments of the present invention will be described in detail with reference to the accompanying drawings. The following exemplary embodiments are provided only for illustrative purposes so that those skilled in the art can fully understand the spirit of the present invention. Therefore, the present invention is not limited to the following exemplary embodiments but may be implemented in other forms. In the drawings, the widths, lengths, thicknesses and the like of elements may be exaggerated for convenience of illustration. Like reference numerals indicate like elements throughout the specification and drawings.

Figure 2:
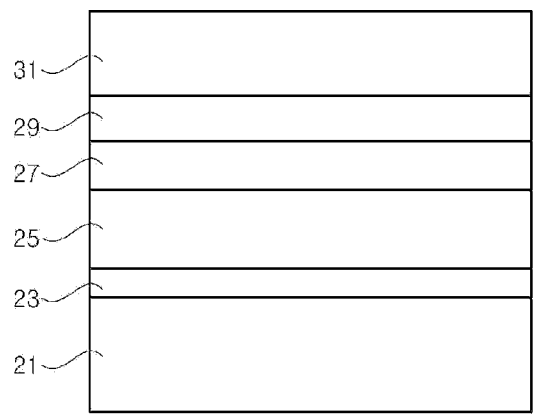
FIG. 2 is a sectional view of an LED according to an exemplary embodiment of the present invention.
Figure 3:
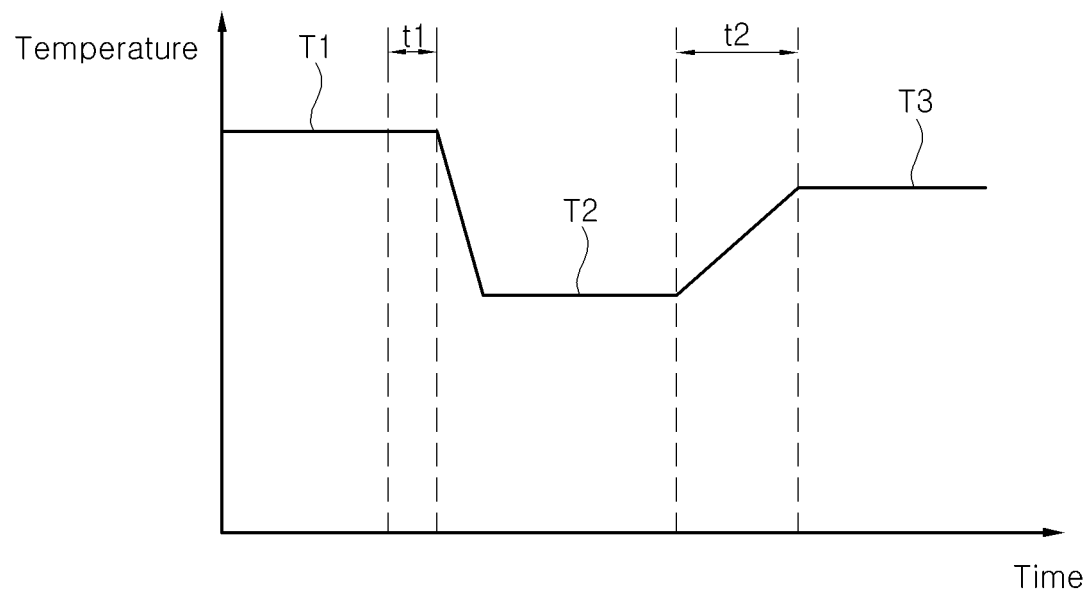
FIG. 3 shows a temperature profile of a method of fabricating an LED according to an exemplary embodiment of the present invention.

FIGS. 2 and 3 show a sectional view of a substrate and a temperature profile of a method of fabricating an LED according to an exemplary embodiment of the present invention.

Referring to FIG. 2, the LED includes, for example, an n-type GaN-based semiconductor layer 25, an active layer 27 and a p-type GaN-based semiconductor layer 31. The LED may also include a substrate 21 and a buffer layer 23, and may further include an n-type clad layer (not shown) and a p-type clad layer 29.

The substrate 21 is a substrate for growing GaN-based semiconductor layers, such as a sapphire substrate, a SiC substrate, or a spinel substrate, and the like. The substrate 21 may be, for example, a patterned sapphire substrate (PSS). The substrate 21 is loaded into a chamber and then heated at a temperature suitable for growth of each layer using a heater.

The buffer layer 23 is a layer for growing an n-type GaN-based semiconductor layer 25 on the substrate 21, and may include a low temperature buffer layer and a high temperature buffer layer. For example, the low temperature buffer layer may be formed of (Al, Ga)N at a low temperature of 400 to 600° C., and may be formed of GaN or AlN to have a thickness of about 25 nm.

Referring to FIG. 3, after the buffer layer 23 is formed, the substrate 21 is heated up to a first temperature T1. Then, a metal source gas, a nitride source gas, and a carrier gas, e.g., hydrogen gas, are supplied into the chamber at the first temperature T1, so that the n-type GaN-based semiconductor layer 25 is grown on the buffer layer 23. The metal source gas may be selected according to the composition of a GaN-based semiconductor layer to be grown. For example, an organic material comprising Al, Ga or In, e.g., trimethyl aluminum (TMA), trimethyl gallium (TMG), and/or trimethyl indium (TMI), may be used as a raw material of the metal source gas. The first temperature T1 may be higher than 1000° C., and may be, for example, 1050 to 1150° C.

After the n-type GaN-based semiconductor layer 25 is grown, the supply of the metal source gas is stopped, and the grown n-type GaN-based semiconductor layer 25 is maintained on the substrate 21 at the first temperature T1 for a first time period t1. The first time period t1 is a time period for which the metal source gas remaining in the chamber may be substantially exhausted. The first time period may be about 3 to 10 minutes, preferably about 5 to 7 minutes. Also, the n-type GaN-based semiconductor layer 25 is heat-treated for the first time period t1, so that the crystal quality of the n-type GaN-based semiconductor layer 25 may be improved and a small surface roughness can be maintained.

The first time period t1 may be set according to the pumping performance of the chamber, the growth temperature of the n-type GaN-based semiconductor layer 25, and the like. If the first time period t1 is excessively short (i.e., less than 3 minutes), the metal source gas may not be substantially exhausted, and the heat-treatment effect on the n-type GaN-based semiconductor layer 25 may be low. Also, if the first time period t1 is excessively long (i.e., greater than 10 minutes), thermal decomposition of the n-type GaN-based semiconductor 25 layer may occur, and therefore, its surface may be roughened.

Then, the temperature of the substrate 21 is decreased from the first temperature T1 to a second temperature T2. The second temperature T2 is set to a temperature suitable for growing the active layer 27. The active layer 27 may have a single or multiple quantum well structure. When a quantum well layer is formed of InGaN, the second temperature T2 may be within a range from 650 to 750° C.

The active layer 27 is grown on the n-type GaN-based semiconductor layer 25 by supplying a metal source gas into the chamber at the second temperature T2. The active layer 27 may be formed to have a multiple quantum well structure in which barrier layers and well layers are alternately formed.

After the growth of the active layer 27 is completed, the supply of the metal source gas is stopped, and the temperature of the substrate 21 is increased to a third temperature T3 over a second time period t2. The second time period t2 is set to a time period for which the metal source gas remaining in the chamber can be substantially exhausted. For example, the second time period t2 may be within a range from 5 to 15 minutes.

Then, a p-type GaN-based semiconductor layer, e.g., the p-type clad layer 29 or p-type GaN-based semiconductor layer 31, is grown by supplying the metal source gas into the chamber at the third temperature T3. The p-type clad layer 29 may be AlGaN. Also, the p-type GaN-based semiconductor layer 31 may be a single layer of GaN or have a multi-layered structure including a GaN layer.

In a conventional method, since it may take a significant amount of time to grow the GaN-based semiconductor layers, the temperature after the growth of an active layer or capping layer is completed was increased up to a temperature for growing a p-type GaN-based semiconductor as fast as possible in order to reduce a time for increasing temperature, in order to reduce a processing time. However, due to the reduced ramping time, the gas condition in a chamber may become unstable, and the metal source gases used in the growth of the active layer may also be used in the growth of the p-type GaN-based semiconductor layer, thereby degrading the crystal quality of the p-type GaN-based semiconductor layer.

On the contrary, in the method of fabricating an LED according to the present exemplary embodiment, the gas condition in the chamber may be stabilized by stopping the supply of the metal source gas after the growth of the active layer 27 or a capping layer on the active layer, and relatively lengthening the second time period t2 for increasing the temperature of the substrate from the second temperature T2 to the third temperature T3. Further, it may be possible to prevent the metal source gas used in the growth of the active layer 27 from being used in the growth of the p-type GaN-based semiconductor layer, thereby improving the crystal quality of the p-type GaN-based semiconductor layer.

After the growth of the epitaxial layers of the LED is completed, individual LED chips may be fabricated using the epitaxial layers.

It has been described in the present exemplary embodiment for convenience of illustration that a semiconductor layer doped with an impurity is used as the n-type semiconductor layer 25, the p-type clad layer 29, or the p-type semiconductor layer 31. However, each of these layers may include a layer undoped with an impurity. Also, a cap layer (not shown) may be formed on the active layer 27, wherein the cap layer is included in the active layer 27.

Although it has been described in the present exemplary embodiment that after the n-type semiconductor layer 25 is grown, the active layer 27 is directly grown thereon, a superlattice layer may be interposed between the n-type semiconductor layer 25 and the active layer 27. The superlattice layer may have a growth temperature lower than that of the n-type semiconductor layer 25. The superlattice layer may be grown by maintaining the n-type semiconductor layer 25 for the first time period t1 after the n-type semiconductor layer is grown and decreasing the temperature to the growth temperature of the superlattice layer. Thereafter, the active layer 27 is grown at the second temperature T2, and a subsequent process is performed by increasing the temperature to the third temperature T3 for the second time period t2.

Figure 4:
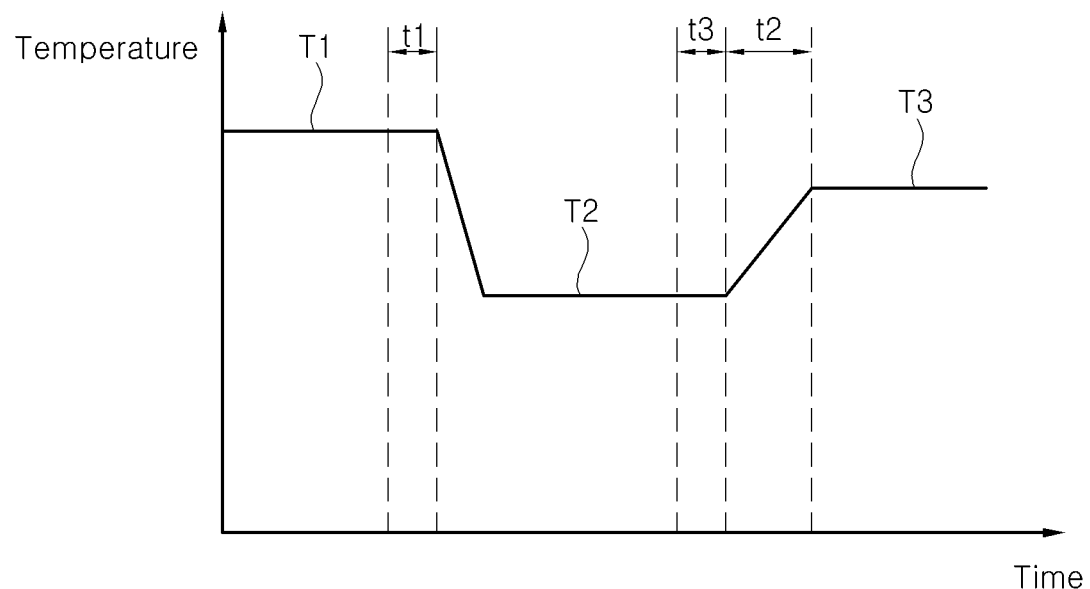
FIG. 4 shows a temperature profile of a method of fabricating an LED according to an exemplary embodiment of the present invention.

FIG. 4 shows a temperature profile of a method of fabricating an LED according to an exemplary embodiment of the present invention.

Referring to FIG. 4, an n-type GaN-based semiconductor layer 25 is first grown on a substrate 21, and an active layer 27 is then grown thereon. The n-type GaN-based semiconductor layer 25 and the active layer 27 may be grown as described with reference to FIG. 3. The active layer 27 is grown at a second temperature T2 by supplying a chamber with a nitride source gas and a metal source gas.

After the active layer 27 is grown, the supply of the metal source gas is stopped, and the grown active layer 27 is maintained on the substrate 21 at the second temperature T2 for a third time period t3. The third time period t3 may be set to a time period during which the metal source gas is substantially exhausted after the active layer is grown. The third time period t3 may be within a range from 3 to 10 minutes similar to the first time period t1.

After the third time period t3 elapses, the temperature of the substrate may be increased to a third temperature T3 during a time period t2, and a p-type GaN-based semiconductor layer 29 or 31 may be grown on the active layer 27 at the third temperature T3 by supplying the chamber with the metal source gas.

After the active layer 27 is grown, the substrate is maintained at the second temperature for the third time period t3, and thus, the gas condition in the chamber can be stabilized for the third time period t3. Accordingly, the second time period t2 for which the temperature of the substrate is increased from the second temperature T2 to the third temperature T3 can be relatively shortened. Further, as described with reference to FIG. 3, the second time period t2 is relatively lengthened within a range from 5 to 15 minutes, so that the growth condition of the p-type GaN-based semiconductor layer can be more stabilized.

In the present exemplary embodiment, a capping layer (not shown) may be grown on the active layer.

Experimental Example

Epitaxial layers were grown using an MOCVD apparatus, and epitaxial wafers were fabricated by changing the first time period t1 and the second time period t2 while keeping other conditions substantially identical. Individual LEDs were fabricated by dividing each epitaxial wafer (Examples 1, 2, and 3). Also, epitaxial wafers were fabricated according to a conventional method, and individual LEDs were fabricated by dividing the epitaxial wafer (Comparative Example). For Example 1, the first time period t1 was set to 3 minutes, and the second time period t2 was set to 1.5 minutes. For Example 2, the first time period t1 was set to zero minutes, and the second time period t2 was set to 5 minutes. For Example 3, the first time period t1 was set to 5 minutes, and the second time period t2 was set to 10 minutes. For the Comparative Example, the first time period t1 was set to zero minute, and a ramping time period from the second temperature T2 to the third temperature T3 was set to 1.5 minutes.

Average values obtained by measuring optical and electrical properties of the respective LEDs of Comparative Example and Examples 1, 2, and 3 are summarized in Table 1. Here, leakage current was measured at a reverse voltage of −5V, and the optical and electrical properties are shown as percentages with respect to measured values of the Comparative Example.

TABLE 1

| | Peak Wavelength (nm) | Forward Voltage (AU) | Optical Output (AU) | Leakage Current @ −5 V (AU) |
|---|---|---|---|---|
| Comp. Example | 448.6 | 100 | 100 | 100 |
| Example 1 | 448.5 | 99.4 | 100.3 | 56.3 |
| Example 2 | 444.2 | 98.4 | 100.9 | 18.8 |
| Example 3 | 453.0 | 99.7 | 101.3 | 12.5 |

Referring to Table 1, Examples 1, 2, and 3 of the present invention showed that forward voltage slightly decreased and optical output slightly increased as compared with the Comparative Example. Meanwhile, Examples 1, 2, and 3 of the present invention all had a lower leakage current as compared with the Comparative Example. Forward voltage, optical output, and leakage current values in Table 1 are shown as arbitrary units relative to the baseline value of the Comparative Example. Particularly, the leakage current showed a value of less than 0.1 μA in Example 1 where the first time period was set to 3 minutes, and the leakage current showed a value of less than 0.05 μA in Example 2 where the second time period t2 was set to 5 minutes. Meanwhile, in Example 3 where the first time period t1 and the second time period t2 were respectively 5 minutes and 10 minutes, the leakage current was less than Example 2 (i.e., less than 0.05 μA).

According to exemplary embodiments of the present invention, after an n-type GaN-based semiconductor layer is grown on a substrate, the temperature of the substrate is maintained for a time period, and an LED with relatively low leakage current may be fabricated. Further, after an active layer is grown, the supply of a metal source gas is stopped, and a time for increasing the temperature of the substrate to a temperature suitable for growing a p-type GaN-based semiconductor layer may be relatively lengthened, or the temperature of the substrate may is be maintained at the growth temperature of the active layer for a time period, thereby a leakage current of the LED may be lowered.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a light-emitting diode (LED), the method comprising:
 growing a first GaN-based semiconductor layer on a substrate at a first temperature, the growing comprising supplying a chamber with a nitride source gas and a first metal source gas;
 stopping the supply of the first metal source gas and maintaining the first temperature for a first time period after stopping the supply of the first metal source gas;
 decreasing a temperature of the substrate to a second temperature after the first time period elapses;
 growing an active layer on the first GaN-based semiconductor layer at the second temperature, the growing comprising supplying the chamber with a second metal source gas;
 stopping the supply of the second metal source gas; and
 increasing the temperature of the substrate from the second temperature to a third temperature during a second time period.

2. The method of claim 1, wherein the first time period is 3 to 10 minutes long.

3. The method of claim 2, wherein the LED comprises a leakage current of less than 0.1 μA under a reverse voltage of −5V.

4. The method of claim 1 wherein the second time period is 5 to 15 minutes long.

5. The method of claim 4, wherein the LED comprises a leakage current of less than 0.05 μA under a reverse voltage of −5V.

6. The method of claim 1, further comprising growing a second GaN-based semiconductor layer on the active layer at the third temperature by supplying a third metal source gas into the chamber.

7. The method of claim 5, wherein the third temperature is lower than the first temperature.

8. The method of claim 1, wherein the first temperature is between 1050 and 1150° C., and the second temperature is between 650 and 750° C.

9. A method of fabricating a light-emitting diode (LED), the method comprising:
 growing a first GaN-based semiconductor layer on a substrate at a first temperature, the growing comprising supplying a chamber with a nitride source gas and a first metal source gas;
 stopping the supply of the first metal source gas and maintaining the first temperature for a first time period after stopping the supply of the first metal source gas;
 decreasing a temperature of the substrate to a second temperature after the first time period elapses; and
 growing an active layer comprising a multiple quantum well structure on the first GaN-based semiconductor layer while maintaining the chamber at the second temperature and supplying the chamber with a second metal source gas.

10. The method of claim 9, wherein the first time period is 3 to 10 minutes long.

11. The method of claim 10, wherein the LED comprises a leakage current of less than 0.1 μA under a reverse voltage of −5V.

12. The method of claim 9, further comprising:
 stopping the supply of the second metal source gas; and
 increasing the temperature of the substrate from the second temperature to a third temperature during a second time period.

13. The method of claim 12, wherein the second time period is 5 to 15 minutes long.

14. The method of claim 13, wherein the LED comprises a leakage current of less than 0.05 μA under a reverse voltage of −5V.

15. The method of claim 12, further comprising growing a second GaN-based semiconductor layer on the active layer at the third temperature by supplying a third metal source gas into the chamber.

16. The method of claim 14, wherein the third temperature is lower than the first temperature.

17. The method of claim 9, wherein the first temperature is between 1050 and 1150° C., and the second temperature is between 650 and 750° C.

18. The method of claim 9, wherein the multiple quantum well structure comprises a plurality of alternately formed barrier layers and well layers.

* * * * *